United States Patent
Ji et al.

(10) Patent No.: US 8,741,165 B2
(45) Date of Patent: Jun. 3, 2014

(54) REDUCING TWISTING IN ULTRA-HIGH ASPECT RATIO DIELECTRIC ETCH

(75) Inventors: Bing Ji, Pleasanton, CA (US); Erik A. Edelberg, San Ramon, CA (US); Takumi Yanagawa, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 98 days.

(21) Appl. No.: 12/900,351

(22) Filed: Oct. 7, 2010

(65) Prior Publication Data

US 2011/0021030 A1      Jan. 27, 2011

Related U.S. Application Data

(62) Division of application No. 11/562,335, filed on Nov. 21, 2006, now abandoned.

(51) Int. Cl.
*B44C 1/22*      (2006.01)

(52) U.S. Cl.
USPC ........... 216/67; 216/58; 216/63; 438/706; 438/710; 438/712; 438/714; 257/E21.218

(58) Field of Classification Search
USPC ............... 216/67, 63, 58; 438/714, 706; 257/E21.218
See application file for complete search history.

(56) References Cited

U.S. PATENT DOCUMENTS

| | | | |
|---|---|---|---|
| 5,928,963 A | 7/1999 | Koshiishi | |
| 6,123,862 A | 9/2000 | Donohoe et al. | |
| 6,127,278 A * | 10/2000 | Wang et al. | 438/719 |
| 6,190,496 B1 | 2/2001 | DeOrnellas et al. | |
| 6,342,165 B1 | 1/2002 | Donohoe et al. | |
| 6,380,095 B1 * | 4/2002 | Liu et al. | 438/719 |
| 6,610,212 B2 | 8/2003 | Donohoe et al. | |
| 6,632,321 B2 | 10/2003 | Lill et al. | |
| 7,094,316 B1 | 8/2006 | Hanawa et al. | |

(Continued)

FOREIGN PATENT DOCUMENTS

| | | |
|---|---|---|
| JP | 09-129612 | 5/1997 |
| JP | 2000-357681 | 12/2000 |

(Continued)

OTHER PUBLICATIONS

Naokatsu Ikegami, "Ultrahigh-Aspect-Ratio Contact Hole Etching," American Physical Society, Gaseous Electronics Conference, Oct. 5-9, 1997, Abstract #CM.202, Internet source: http://adsabs.harvard.edu/abs/1997APS..GEC.CM2021, retrieved on Jun. 22, 2010, 1 page.

Search Report dated Oct. 28, 2010 from Singapore Patent Application No. 200903279-8.

(Continued)

*Primary Examiner* — Lan Vinh
*Assistant Examiner* — Jiong-Ping Lu
(74) *Attorney, Agent, or Firm* — Beyer Law Group LLP

(57) ABSTRACT

An apparatus for etching a dielectric layer contained by a substrate is provided. An etch reactor comprises a top electrode and a bottom electrode. An etch gas source supplies an etch gas into the etch reactor. A first Radio Frequency (RF) source generates a first RF power with a first frequency and supplies the first RF power into the etch reactor, whereas the first frequency is between 100 kilo Hertz (kHz) and 600 kHz. A second RF source generates a second RF power with a second frequency and supplies the second RF power into the etch reactor, whereas the second frequency is at least 10 mega Hertz (MHz).

19 Claims, 9 Drawing Sheets

(56) References Cited

U.S. PATENT DOCUMENTS

| | | | |
|---|---|---|---|
| 2001/0020516 A1* | 9/2001 | Khan et al. | 156/345 |
| 2002/0117472 A1 | 8/2002 | Sun et al. | |
| 2004/0025791 A1 | 2/2004 | Chen et al. | |
| 2004/0144490 A1 | 7/2004 | Zhao et al. | |
| 2004/0260420 A1* | 12/2004 | Ohno et al. | 700/121 |
| 2005/0039682 A1 | 2/2005 | Dhindsa et al. | |
| 2005/0090118 A1* | 4/2005 | Shannon et al. | 438/706 |
| 2006/0066247 A1* | 3/2006 | Koshiishi et al. | 315/111.21 |
| 2006/0118518 A1* | 6/2006 | Rusu et al. | 216/67 |

FOREIGN PATENT DOCUMENTS

| | | |
|---|---|---|
| KR | 10-0144429 | 4/1998 |
| KR | 10-1999-0066848 | 8/1999 |
| TW | 530322 | 5/2003 |
| WO | WO95/32315 A1 | 11/1995 |
| WO | WO2005/022623 A1 | 3/2005 |

OTHER PUBLICATIONS

Written Opinion dated Oct. 28, 2010 from Singapore Patent Application No. 200903279-8.
Office Action dated Oct. 8, 2010 from Chinese Application No. 200780043206.0.
International Search Report dated Apr. 28, 2008 from International Application No. PCT/US2007/083133.
Written Opinion dated Apr. 28, 2008 from International Application No. PCT/US2007/083133.
Office Action dated Sep. 24, 2009 from U.S. Appl. No. 11/562,355.
Office Action dated Apr. 1, 2010 from U.S. Appl. No. 11/562,355.
Final Office Action dated Aug. 6, 2010 from U.S. Appl. No. 11/562,355.
Office Action dated Jun. 20, 2013 from Taiwanese Patent Application No. 096141692.
Search Report dated Jun. 20, 2013 from Taiwanese Patent Application No. 096141692.

* cited by examiner

REDUCING TWISTING IN ULTRA-HIGH ASPECT RATIO DIELECTRIC ETCH

CROSS REFERENCE TO RELATED APPLICATIONS

This application is a divisional of and claims priority under 35 U.S.C. §120 to U.S. patent application Ser. No. 11/562,335 filed on Nov. 21, 2006 and entitled "Reducing Twisting in Ultra-High Aspect Ratio Dielectric Etch" which is incorporated by reference herein for all purposes.

BACKGROUND OF THE INVENTION

The present invention relates to the fabrication of semiconductor devices.

Plasma-etching processes are commonly used in the fabrication of semiconductor devices. Generally, photoresist material forms feature patterns on the surface of the wafer to be etched, and features are then etched into the wafer by exposing the wafer to a particular type of etching gas. One of the challenges faced in plasma etching is the ever-increasing aspect ratio needed to meet design requirements, especially for ultra-high density structures. When etching features on semiconductor wafers, the aspect ratio of an etched feature is defined as the ratio between the feature's depth (d) and the feature's width (w) or diameter. As more features are packed on a single piece of wafer to create higher density structures, the width (w) or diameter of each individual feature necessarily decreases, while the depth of the features remains unchanged. Thus, the aspect ratio of each individual feature increases as the device feature shrinks.

A new difficulty emerged recently during ultra-high aspect ratio (UHAR) etch is twisting, which is generally defined as deviations of location, orientation, shape, and size near the bottom of a feature from the pattern defined by the mask on the top of the feature. When the aspect ratio of a feature reaches a certain threshold while the feature's width is very small, twisting occurs, particularly near the bottom of the feature.

FIG. 1A shows the side view of a wafer with four etched features, where twisting occurred near the bottom of each feature. In FIG. 1A, a mask 100 deposited on the surface of the wafer 110 masked four features 120, 122, 124, 126. The four features 120, 122, 124, 126 are etched into the wafer 110 all the way to the stop layer 130. The four features 120, 122, 124, 126 each has a width, W, and a depth, D. The aspect ratio of each of the four features 120, 122, 124, 126 is D/W. As shown in FIG. 1A, the sidewalls of the features 120, 122, 124, 126 are not straight but are curved near the bottom of the features. Such deviations near the bottom of the features 120, 122, 124, 126 from the pattern defined by the mask 100 are twisting.

Generally, twisting may manifest in one or more of the following forms. Lateral twisting is defined as deviation of the etch profile center from the vertical straight line near the bottom of a feature. Angular twisting is defined as deviation of the angular orientation of the etch profile from a predefined angle near the bottom of a feature. Shape twisting is defined as deviation of the etch profile from a predefined uniform shape near the bottom of a feature. All three forms of twisting may occur simultaneously within a single feature.

FIG. 1B shows the top view of samples of various forms of twisting near the bottom of the etched features. When twisting occurs, the oval-shaped cross-section is not perfect in size, position, orientation, shape, or a combination thereof. In FIG. 1B, for lateral twisting, the cross-sections 140, 142, 144, 146, 148 shift so that the center of the ovals are no longer at the center of the original pattern. For angular twisting, the cross-sections 150, 152, 154, 156, 158 rotate so that the ovals are no longer aligned with the original pattern. For shape twisting, the cross-sections 160, 162, 164, 166, 168 are no longer in the original oval shape. Finally, in case of combination twisting, the cross-sections 170, 172, 174, 176, 178 simultaneously shift, rotate, and change shape. All forms of twisting result in defects and device failures. Therefore, it is desirable to reduce or eliminate twisting during UHAR etch.

SUMMARY OF THE INVENTION

To achieve the foregoing and in accordance with the purpose of the present invention, an apparatus for etching a dielectric layer over a substrate is provided. An etch reactor comprises a top electrode and a bottom electrode. An etch gas source supplies etch gas into the etch reactor. A first Radio Frequency (RF) source generates a first RF power with a first frequency and supplies the first RF power into the etch reactor, whereas the first frequency is between 100 kilo Hertz (kHz) and 600 kHz. A second RF source generates a second RF power with a second frequency and supplies the second RF power into the etch reactor, whereas the second frequency is at least 10 mega Hertz (MHz).

In another embodiment of the invention, an apparatus for etching a dielectric layer over a substrate is provided. An etch reactor comprises a top electrode and a bottom electrode. An etch gas source supplies etch gas into the etch reactor. A first RF source generates a first RF power with a first frequency and supplies the first RF power into the etch reactor, whereas the first frequency is between 100 kilo Hertz (kHz) and 600 kHz. A second RF source generates a second RF power with a second frequency and supplies the second RF power into the etch reactor, whereas the second frequency is at least 10 mega Hertz (MHz). A third RF source generates a third RF power with a third frequency and supplies the third RF power into the etch reactor, whereas the third frequency is at least 40 MHz.

In another embodiment of the invention, a method for etching features in a dielectric layer over a substrate is provided. The substrate with the dielectric layer is placed on a bottom electrode inside an etch reactor, whereas the dielectric layer is over the substrate. An etch gas is delivered into the etch reactor. A first RF power with a first frequency is delivered into the etch reactor, whereas the first frequency is between 100 kHz and 600 kHz. A second RF power with a second frequency is delivered into the etch reactor, whereas the second frequency is at least 10 MHz. The dielectric layer is etched to form at least one ultra-high aspect ratio feature.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1A:
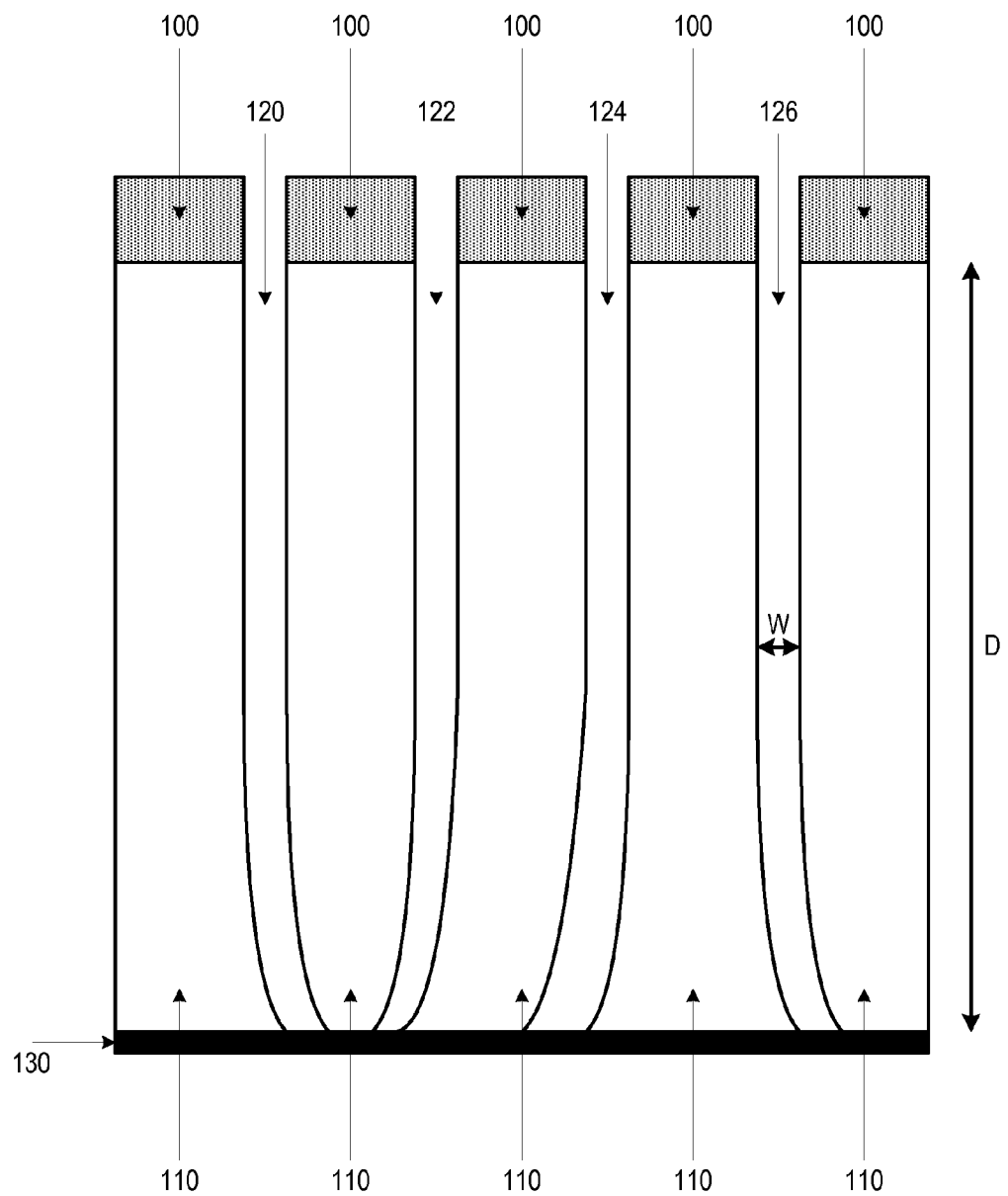
FIG. 1A (prior art) shows the side view of a wafer with four etched features, where twisting occurred near the bottom of each feature.
Figure 1B:
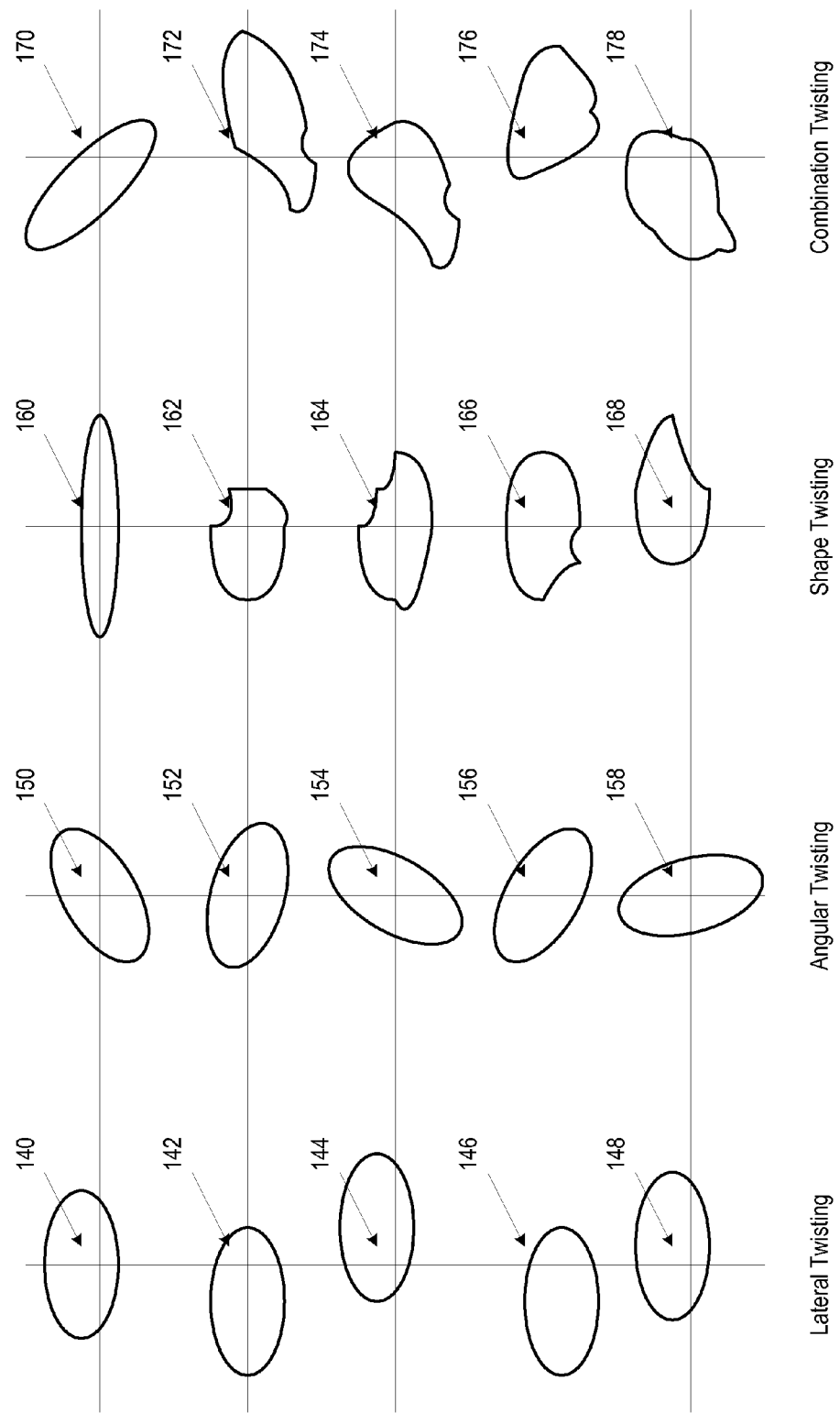
FIG. 1B (prior art) shows the top view of samples of various forms of twisting near the bottom of the etched features.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Without wishing to be bound by the following, it is tentatively theorized that twisting is a result of asymmetric etching in ultra-high aspect ratio (UHAR) features. There are several mechanisms contributing to asymmetric etching as the feature aspect ratio increases. The main mechanism is asymmetric deflection of incident ion trajectories near the bottom of the UHAR features. Anisotropic reactive ion etch (RIE) is a result of complex reactions between the exposed dielectric surfaces and the reactive neutral radicals and ions from the plasma. The flux of the neutral species to the bottom of a feature is dominated by Knudsen diffusion and the sticking coefficient of the species to the feature sidewalls. The fluorocarbon radicals commonly used in dielectric etch typically have high sticking coefficient, and hence their flux to the bottom of a feature strongly depend on the aspect ratio (AR) of the feature.

As a feature's AR increases (typically greater than 10-to-1), neutral fluxes reaching the bottom of the feature become greatly diminishes and can no longer drive the etch reactions. At high and especially ultra-high aspect ratio (typically greater than 10-to-1 and especially greater than 15-to-1), etch reactions are driven by ion fluxes to the bottom of the feature. Ion fluxes to the bottom of the feature is dominated by plasma ion density, ion energy distribution, and the feature's bottom potential due to differential charging. Ions are first accelerated by the electrical field across the plasma sheath. The sheath electrical field is determined by the bulk plasma potential and the wafer surface potential, which is driven by the applied Radio Frequency (RF) fields.

In advanced plasma etchers, multiple radio frequencies are used to drive the plasma. For example, 27 mega Hertz (MHz) and/or 60 MHz RF power, also known as "source RF power," is used to maintain plasma density, while 2 MHz RF power, also known as "bias RF power," is used to drive the plasma sheath potential. At the wafer's top surface, charge balance is achieved by the momentary electron flux when the plasma sheath collapses during an RF cycle. However, electron flows are not directional, and thus cannot reach the bottom of the UHAR features efficiently. As a result, the bottom of the UHAR features accumulates residual positive charges over an RF cycle. This is called differential charging. In other words, more ions reach the bottom of the UHAR features than electrons, resulting in positive differential charging at the bottom of the UHAR features, which gives higher differential potential at the bottom of the UHAR features.

Differential charging causes the increase of the potential at the bottom of the UHAR features, which retards or deflects the incident ions towards the bottom of the UHAR features. Differential charging also causes the slowing down of etch rate as AR increases, a phenomenon well known as aspect ratio dependent etching (ARDE). In other words, when incident energy is below the differential charging potential, ions are deflected. On the other hand, when incident energy is above the differential charging potential, ions are slowed down, but not deflected, causing lower etch rate at ultra-high aspect ratio. If differential charging is asymmetrical due to some random preferential build up of polymer residues or charges at ultra-high aspect ratio, ion deflection becomes asymmetrical. Asymmetrical ion deflection causes asymmetrical etching in some random direction, so the etch front becomes asymmetrical. This is a feed forward mechanism: asymmetrical etch front enhances asymmetrical differential charging, which further propagates the asymmetrical etch front, and so on. As a result, twisting occurs at UHAR etch.

The invention provides an apparatus and a method for reducing twisting in UHAR dielectric etch. During the fabrication of semiconductor devices, often, features are etched through a mask into a layer to be etched over a substrate. The aspect ratio of a feature is the depth-to-width ratio of the feature opening. Previously, a depth-to-width ratio of 5-to-1 was considered high. More recently, the term "high aspect ratio" referred to depth-to-width ratio around 10-to-1. Now, the aspect ratio of etched features is higher still. Preferably, an ultra-high aspect ratio (UHAR) for a feature for this invention is defined as a depth-to-width ratio greater than 15-to-1. More preferably, an UHAR for a feature for this invention is defined as at least 20-to-1. In addition, preferably, the present invention applies to etching features in the dielectric layer with a width of no more than 300 nanometers (nm). More preferably, the present invention applies to etching features in the dielectric layer with a width of no more than 200 nm. Most preferably, the present invention applies to etching features in the dielectric layer with a width of no more than 150 nm.

Preferably, the present invention applies to any dielectric etch. More preferably, the present invention applies to dielectric etch where the dielectric layer is silicon oxide based. In other words, the dielectric layer is formed mainly of silicon oxide with smaller amounts of other types of material mixed in.

An apparatus and a method for reducing twisting in UHAR dielectric etch have been discovered unexpectedly. Specifically, by replacing the 2 MHz bias RF power with a lower frequency bias power, the twisting can be effectively reduced without the drawbacks of the methods described above. In one or more embodiments of the invention, preferably, the bias RF power has a frequency between 100 kilo Hertz (kHz) and 600 kHz. More preferably, the bias RF power has a frequency between 200 kHz and 600 kHz. Even more preferably, the bias RF power has a frequency between 350 kHz and 450 kHz. Most preferably, the bias RF power has a frequency of 400 kHz.

Figure 2:
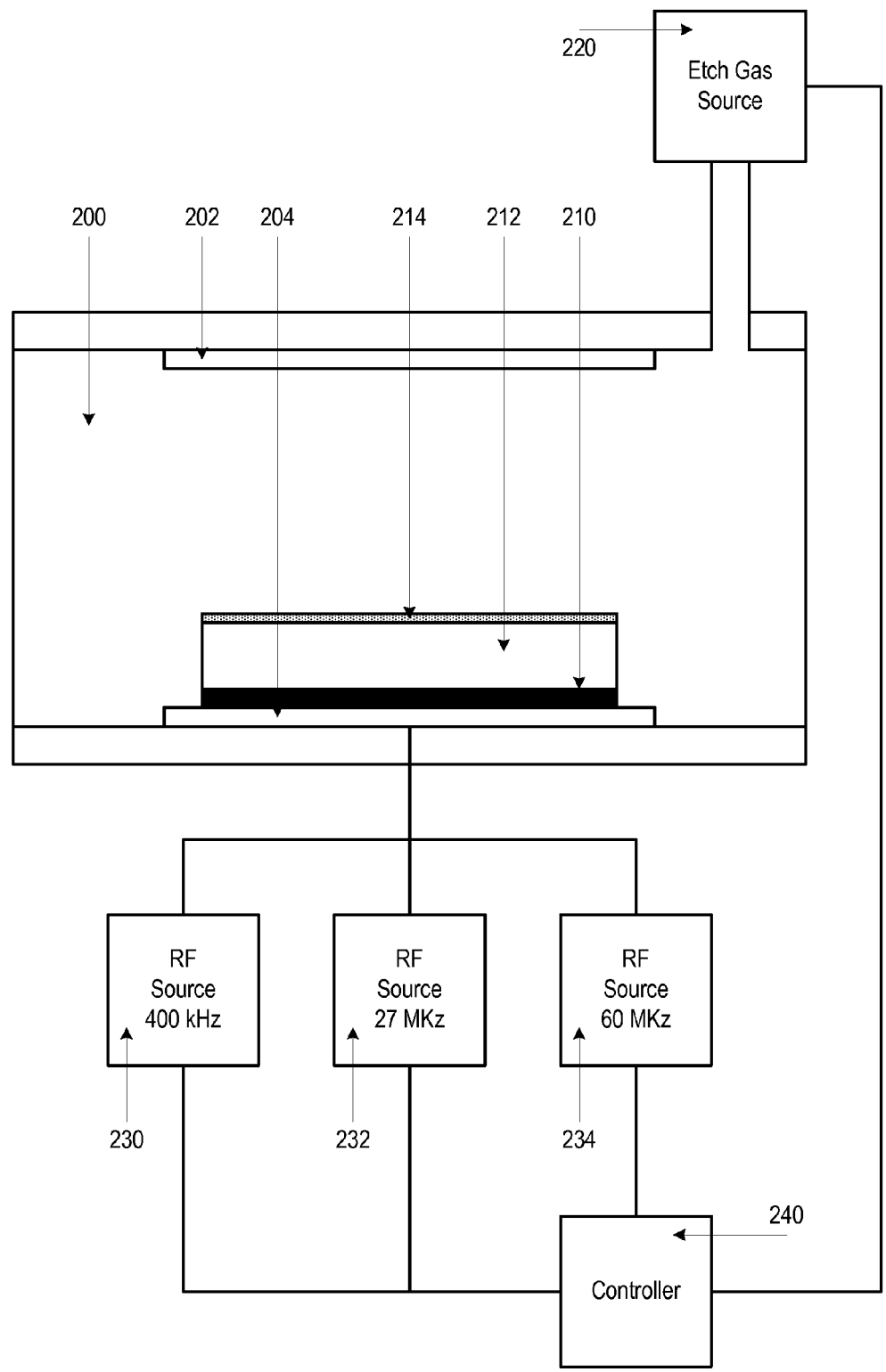
FIG. 2 is a schematic view of an etch reactor that may be used in practicing the invention.

FIG. 2 is a schematic view of an etch reactor that may be used in practicing the invention. In one or more embodiments of the invention, an etch reactor 200 comprises a top electrode 202 and a bottom electrode 204. Also within the etch reactor 200, a substrate 210 is positioned on top of the bottom electrode 204. Over the substrate 210 is a dielectric layer 212, and this is the layer to be etched. A mask 214 is deposited over the dielectric layer 212, which masks the patterns for the features to be etched. Optionally, the bottom electrode 204 incorporates a suitable substrate chucking mechanism (e.g., electrostatic, mechanical clamping, or the like) for holding the substrate 210.

Preferably, the dielectric layer 212 is silicon oxide based—that is, the dielectric layer is mainly formed of silicon oxide, with smaller amounts of other types of substance mixed in. Features are to be etched into this dielectric layer.

An etch gas source 220 is connected to the etch reactor 200 and supplies the etch gas into the etch reactor 200 during the etch processes.

A first RF source 230 is electrically connected to the etch reactor 200. More specifically, the first RF source 230 is electrically connected to the bottom electrode 204. This first RF source 230 is also known as the "bias RF source." It generates bias RF power and supplies the bias RF power to the etch reactor 200. Preferably, the bias RF power has a frequency between 100 kilo Hertz (kHz) and 600 kHz. More preferably, the bias RF power has a frequency between 200 kHz and 600 kHz. Even more preferably, the bias RF power has a frequency between 350 kHz and 450 kHz. Most preferably, the bias RF power has a frequency of 400 kHz.

The bias RF power level varies according to the process needs and generator capacity. Preferably, the bias RF power level is in the range of 100 Watts (W) to 10000 W. More preferably, the bias RF power level is in the range of 500 W to 5000 W. Most preferably, the bias RF power level is in the range of 1000 W to 4000 W for a 300-millimeter (mm) plasma etch reactor.

A second RF source 232 is electrically connected to the etch reactor 200. More specifically, the second RF source 232 is electrically connected to the bottom electrode 204. This second RF source 232 is also known as the "source RF source." It generates source RF power and supplies the source RF power to the etch reactor 200. Preferably, this source RF power has a frequency that is greater than the bias RF power. More preferably, this source RF power has a frequency that is greater than or equal to 10 MHz. Most preferably, this source RF power has a frequency of 27 MHz.

Optionally, a third RF source 234 is electrically connected to the etch reactor 200. More specifically, the third RF source 234 is electrically connected to the bottom electrode 204. Similar to the second RF source 232, this third RF source 234 is also known as the "source RF source." It generates another source RF power and supplies the source RF power to the etch reactor 200, in addition to the RF power generated by the second RF source 232. Preferably, this source RF power has a frequency that is greater than the bias RF power. More preferably, this source RF power has a frequency that is greater than or equal to 40 MHz. Most preferably, this source RF power has a frequency of 60 MHz.

The low frequency bias RF power 230 may be scaled with the wafer size to achieve comparable power density and sheath potential. The 400 kHz bias RF power may be used in combination with one or more higher frequency RF power, such as 27 MHz and/or 60 MHz, to sustain the plasma. Other RF powers may be applied either at the same bottom wafer electrode 2-4, and/or at the opposite top electrode 202 of the etch reactor 200. The low frequency bias power 230 may be delivered into the etch reactor 200 by capacitive coupling. The higher frequency RF power 232, 234 may be delivered into the etch reactor 200 by either capacitive coupling or inductive coupling.

A controller 240 is connected to the etch gas source 220, the first RF source 230, the second RF source 232, and the third RF source 244 if it is present. The controller 240 controls the flow of the etch gas into the etch reactor 200, as well as the generation of the RF power from the three RF sources 230, 232, 234.

Figure 3A:
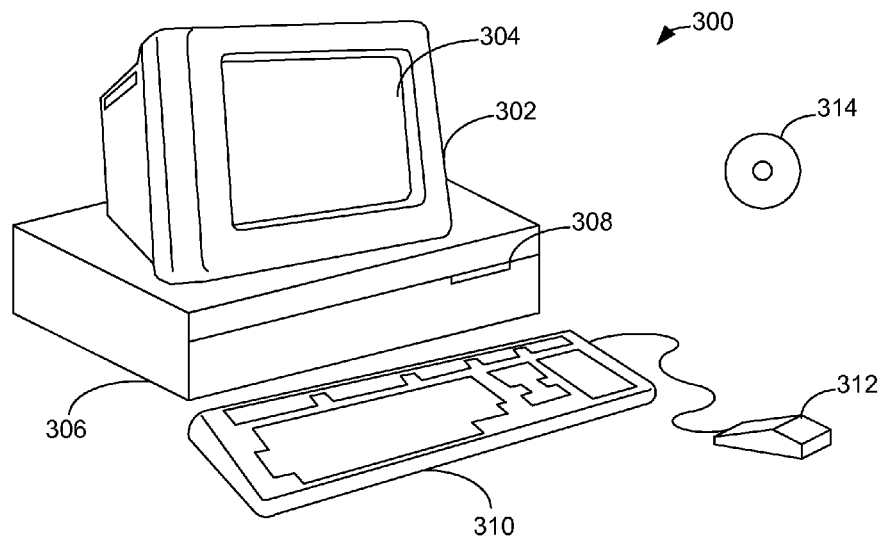
FIGS. 3A and 3B illustrate a computer system, which is suitable for implementing the controller used in one or more embodiments of the present invention.
Figure 3B:
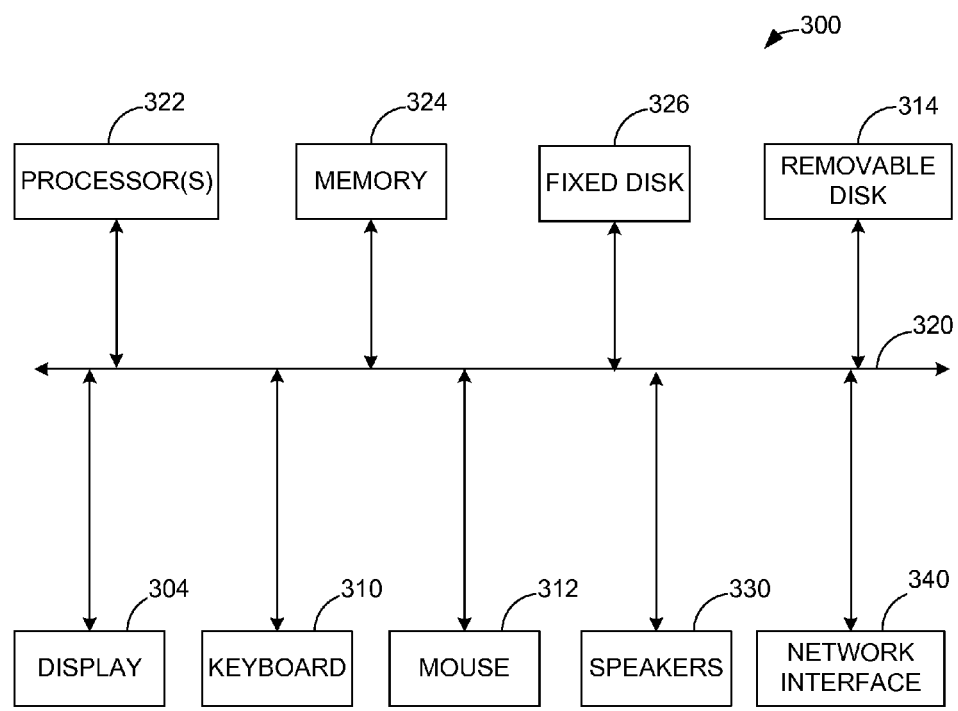

FIGS. 3A and 3B illustrate a computer system, which is suitable for implementing the controller used in one or more embodiments of the present invention. The controller 340 is shown in FIG. 3. FIG. 3A shows one possible physical form of the computer system 300. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 is a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of any of the computer-readable media described below.

CPU 322 is also coupled to a variety of input/output devices, such as display 304, keyboard 310, mouse 312 and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magnetooptical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

Figure 4:
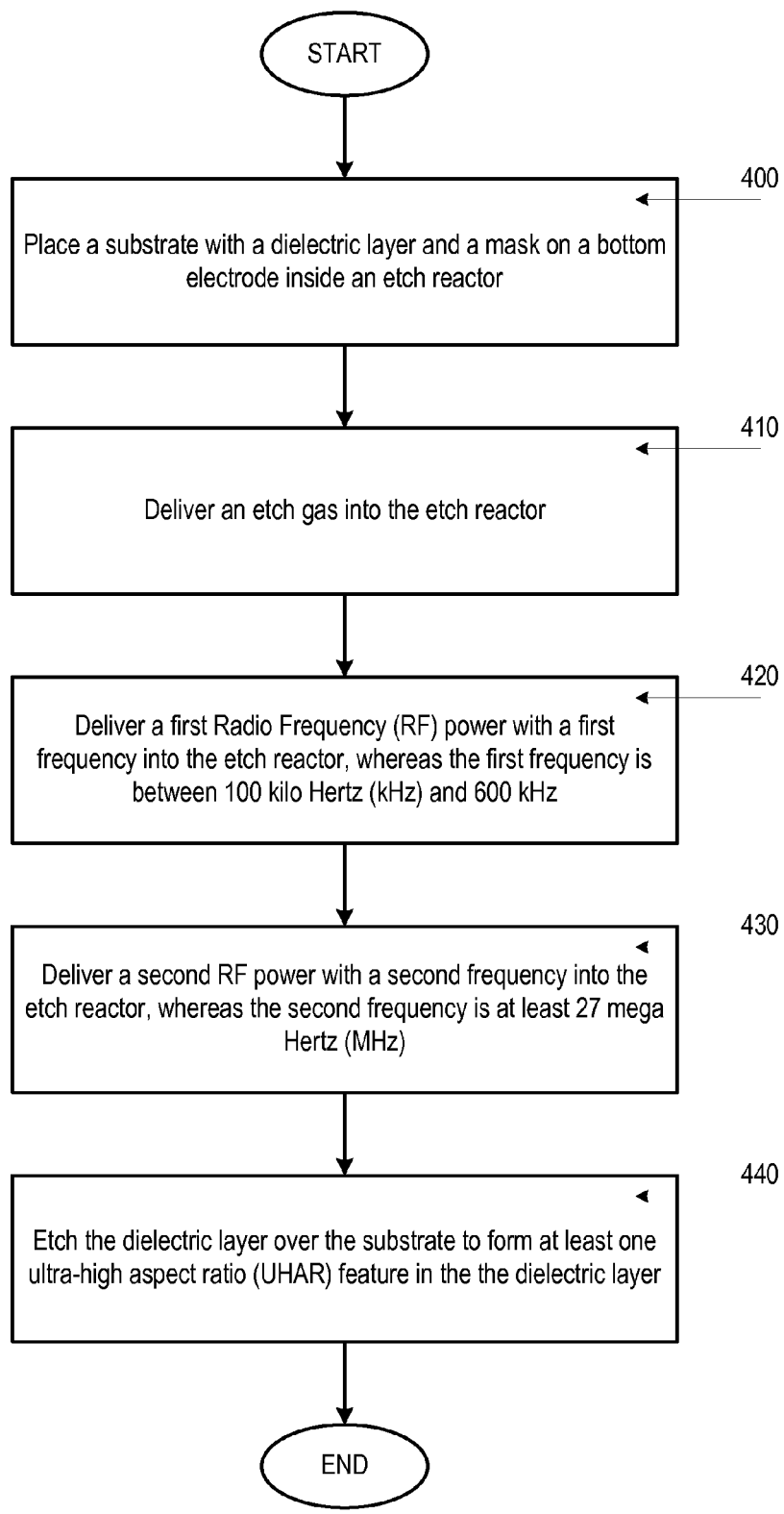
FIG. 4 is a high level flow chart of a process that may be used in an embodiment of the invention.

FIG. 4 is a high level flow chart of a process that may be used in an embodiment of the invention. In one or more embodiment of the invention, a substrate with a dielectric layer and a mask is placed on the bottom electrode inside an etch reactor STEP 400. The dielectric layer is over the substrate, and the mask is over the dielectric layer. The dielectric layer is to be etched. The etch feature patterns have already been masked over the dielectric layer, perhaps by deposition using photoresist material. The dielectric layer may be silicon oxide based.

Etch gas is delivered into the etch reactor STEP 410. Preferably, the etch gas comprises a combination of fluorocarbon ($C_xF_y$), oxygen, and a type of inert gas, such as argon (Ar) or xenon (Xe). More preferably, the etch gas is free of nitrogen trifluoride ($NF_3$) and sulfur hexafluoride ($SF_6$). Even more preferably, the etch gas is free of hydrofluorocarbon ($C_xH_yF_z$).

At the same time, a first RF power with a frequency between 100 kHz and 600 kHz is delivered into the etch reactor STEP 420. And a second RF power with a frequency that is at least 10 MHz is also delivered into the etch reactor STEP 430. The etch gas is transformed to plasma. The first, lower frequency RF power may be delivered into the etch reactor by capacitive coupling. The second, higher frequency RF power may be delivered into the etch reactor by either capacitive coupling or inductive coupling. Optionally, a third RF power with a frequency that is at least 40 MHz is delivered into the etch reactor in addition to the second RF power. Finally, the dielectric layer of the substrate is etched to form at least one UHAR feature according to the masked patterns STEP 440.

By using two RF powers (one bias RF power and one source RF power) or three RF powers (one bias RF power and two source RF powers) and keeping the bias RF power at a low frequency, such as near 400 kHz while maintaining the source RF powers at a high frequency, such as near 27 MHz and 60 MHz, the twisting may be reduced during UHAR dielectric etch processes, resulting in more perfectly etched features.

Figure 5A:
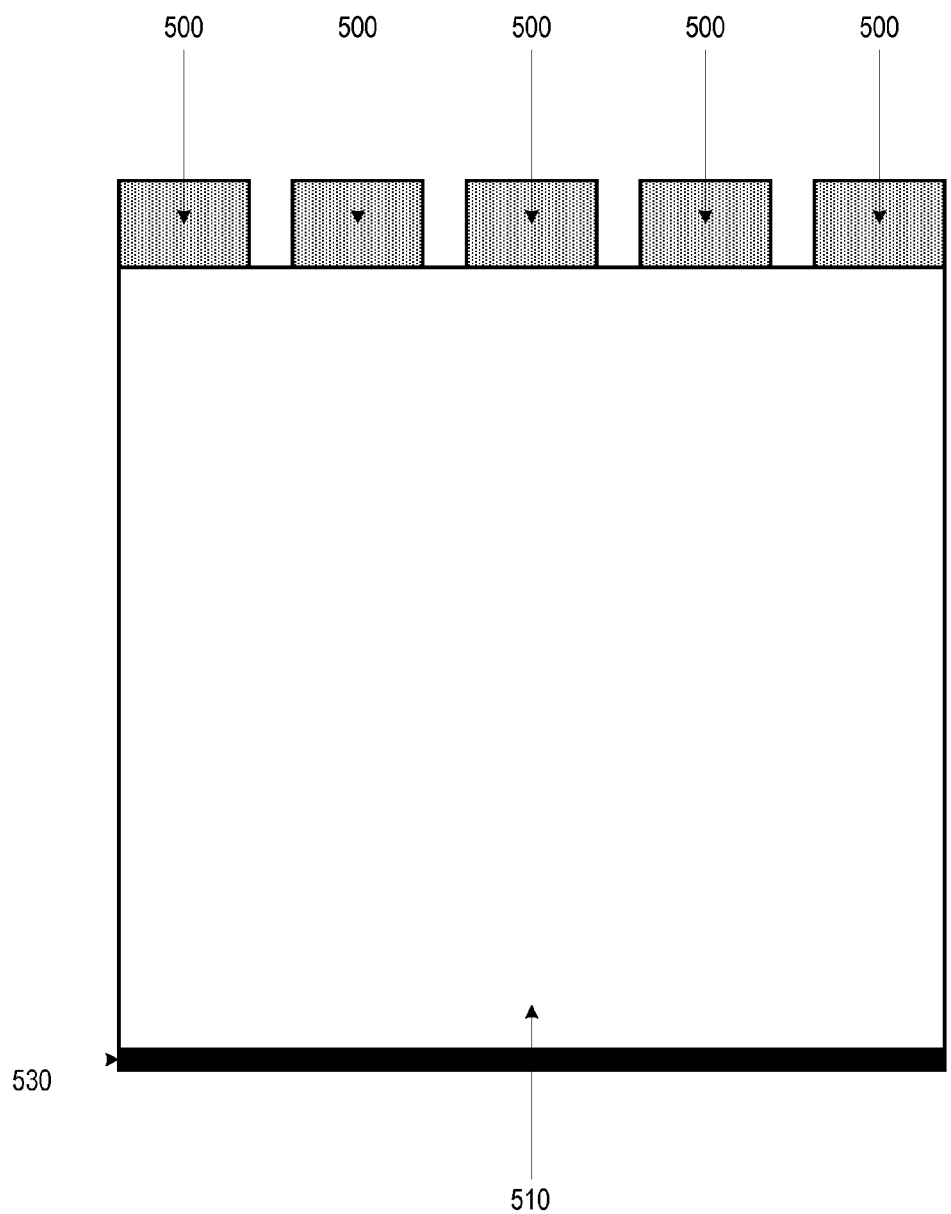
FIG. 5A shows an illustrative side view of a stack to be etched using the invention.

FIG. 5A shows an illustrative side view of a stack to be etched using the invention. A patterned mask 500 is over the dielectric layer 510, which is in turn over a stop layer 530, which is in turn over a substrate. The mask 500 indicates that four features are to be etched into the dielectric layer 510.

Figure 5B:
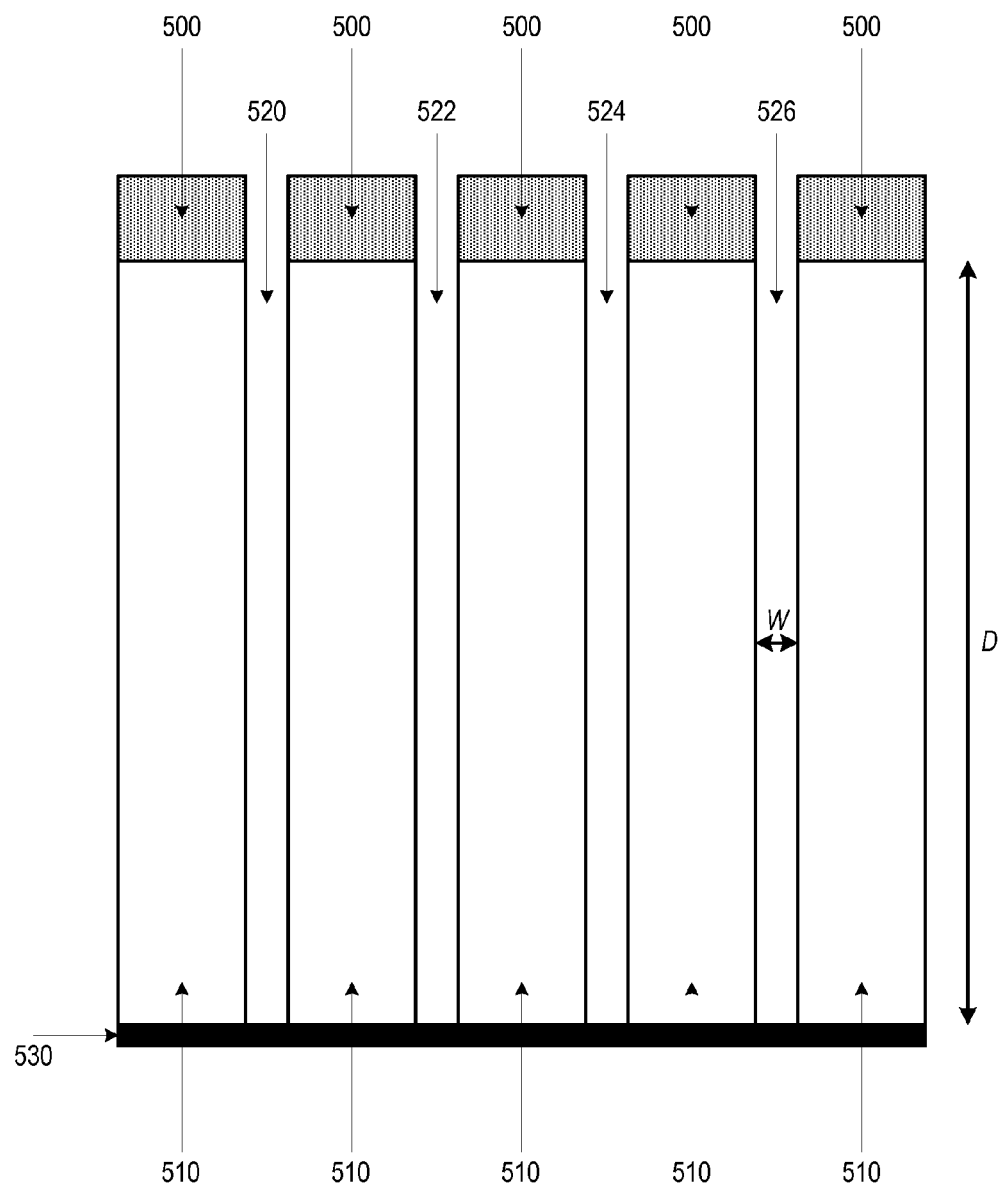
FIG. 5B shows an illustrative side view of the stack in FIG. 5A etched using the invention.

FIG. 5B shows an illustrative side view of the stack in FIG. 5A etched using the invention. Four features 520, 522, 524, 526 are etched into the dielectric layer 510 all the way to the stop layer 530 according to the patterned mask 500. The four features 520, 522, 524, 526 each have a width, W, and a depth, D. The aspect ratio of each of the four features 520, 522, 524, 526 is D/W. As shown in FIG. 5B, the four features 520, 522, 524, 526 have minimal twisting from the top all the way to the bottom. The sidewalls of each feature are vertical. A vertical sidewall is defined as being sides that form an angle between 88° and 92° from the top to the bottom of the sides with respect to the bottom of the feature.

Figure 5C:
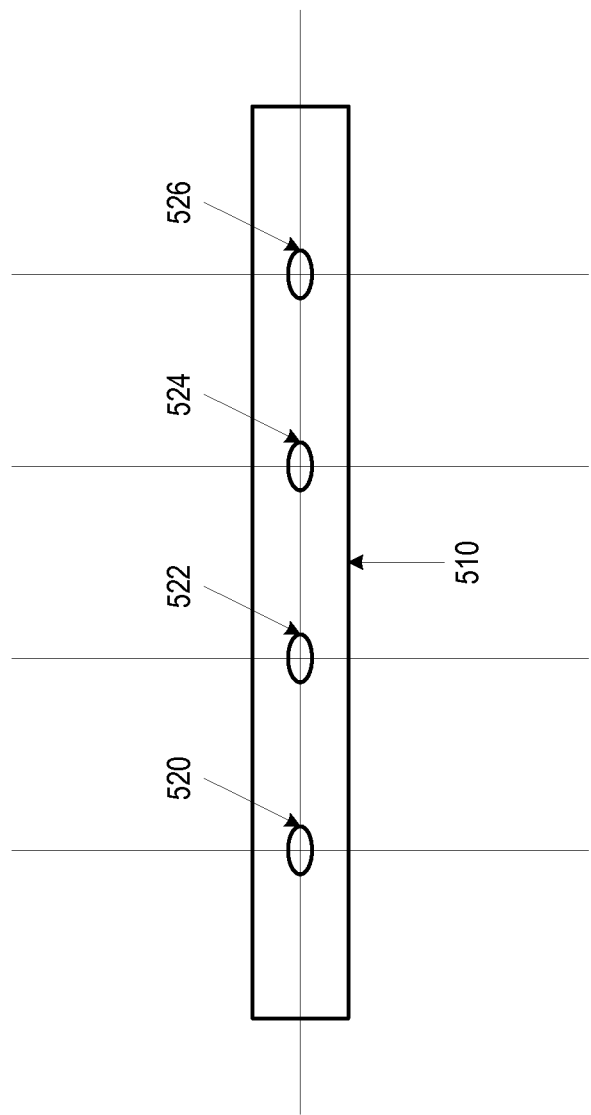
FIG. 5C shows an illustrative top view of a cross-section taken near the bottom of the four features etched in FIG. 5B.

FIG. 5C shows an illustrative top view of a cross-section taken near the bottom of the four features etched in FIG. 5B. There are four features 520, 522, 524, 526 etched in the dielectric layer 510. Each feature is an oval with its origin at the center of the feature. There is no lateral, angular, or shape twisting.

Figure 6:
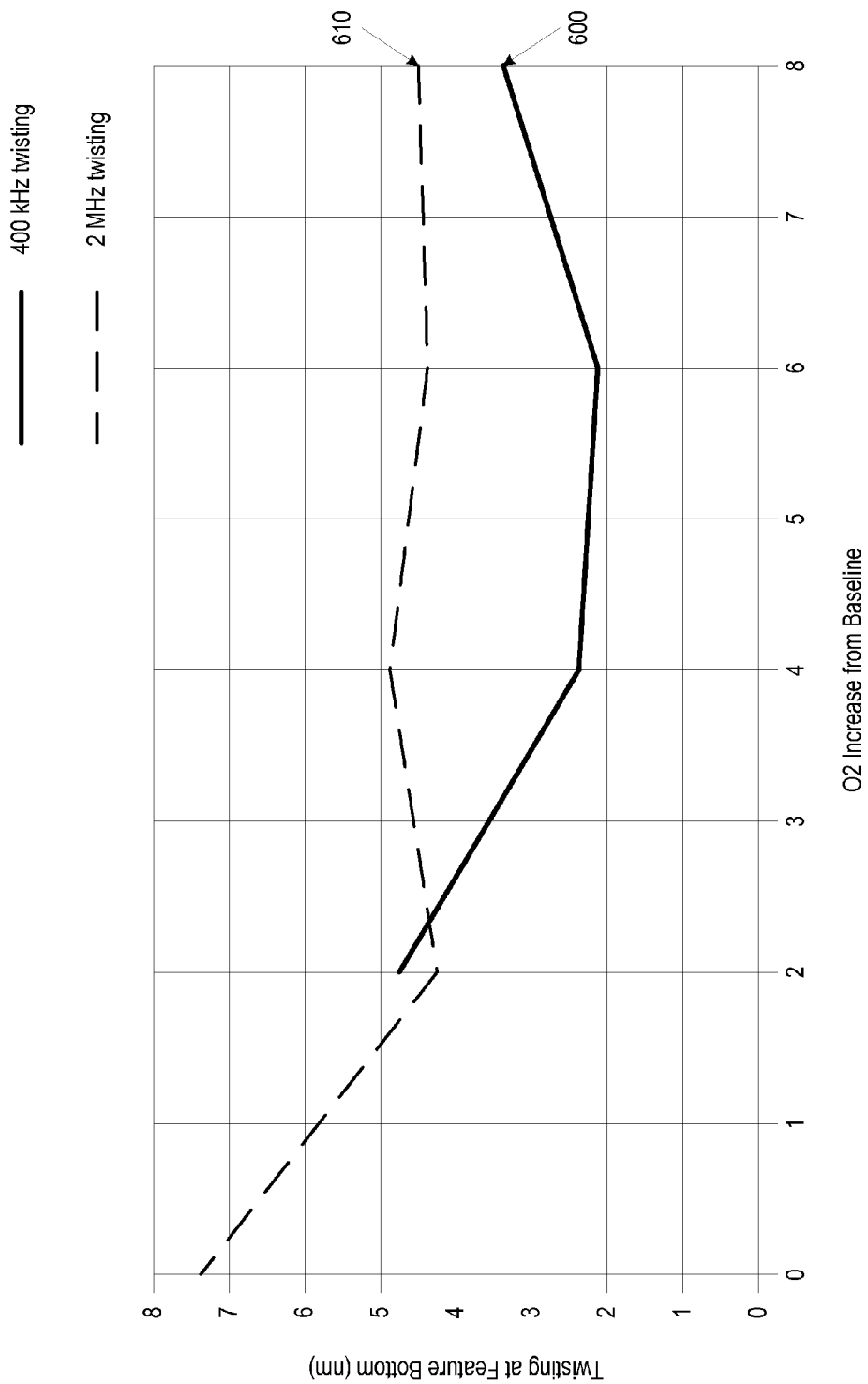
FIG. 6 shows a comparison of twisting from using 400 kHz bias RF power and 2 MHz bias RF power during UHAR dielectric etch processes.

FIG. 6 shows a comparison of twisting from using 400 kHz bias RF power and 2 MHz bias RF power during UHAR dielectric etch processes. The two etch processes have exactly the same formula except the frequency for the bias power. Specifically, the etch chamber pressure is 30 milli-Torr (mTorr). The etch gas comprises 150 standard cubic centimeters per minute (sccm) of argon (Ar), 4 sccm of $C_4F_6$, 18 sccm of $C_4F_8$, and 17 to 25 sccm of oxygen ($O_2$). The source RF power is at 2000 watts (W) with a frequency of 27 MHz. The solid line 600 represents the amount of twisting from using the bias RF power at 2000 W with a frequency of 400 kHz, and the dash line 610 represents the amount of twisting from using the bias RF power at 2000 W with a frequency of 2 MHz. As the oxygen ($O_2$) increases from baseline, the amount of twisting from using 400 kHz bias RF power is significantly less than the amount of twisting from using 2 MHz bias RF power.

The data indicate that twisting is reduced from about 4 nm with 1-sigma standard deviation using 2 MHz bias RF power to about 2 nm with 1-sigma standard deviation suing 400 kHz bias RF power. In fact, the 2 nm with 1-sigma standard deviation of the bottom ellipse gap distances is mainly due to the scanning electron microscopy (SEM) resolution limit at about 2 nm per pixel. Therefore, by using 400 kHz bias RF power, twisting is essentially eliminated over a range of $O_2$ flows in UHAR etch with aspect ratio over 20-to-1.

As described above, twisting is the result of asymmetric etching in UHAR features, and it is desirable to eliminate, or at least reduce twisting as much as possible. Efforts have been made toward this goal. For example, one method is to suppress plasma polymer formation by adjusting the etch chemistry. However, this method has significant disadvantages because less polymerizing chemistry severely degrades mask and/or substrate selectivity, resulting in loss of critical dimension (CD) and top profile distortion (striation). Another method is to increase the ion acceleration across the plasma sheath. However, this method also has disadvantages since it tends to worsen top profile striation. The present invention is able to overcome these problems.

The present invention has several advantages over the methods previously used. First, it almost eliminates twisting completely for UHAR etch over a range of $O_2$ flows with AR greater than 15-to-1 and especially with AR greater than 20-to-1. Second, it does not have any of the drawbacks that other methods have. Specifically, the present invention does not result in the loss of critical dimension and top profile distortion, and it does worsen the top profile striation.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features in a dielectric layer over a substrate, comprising:
   placing the substrate with the dielectric layer on a bottom electrode inside an etch reactor;
   delivering an etch gas into the etch reactor;
   delivering a first RF power with a first frequency into the etch reactor, whereas the first frequency is between 100 kHz and 600 kHz;
   delivering a second RF power with a second frequency into the etch reactor, whereas the second frequency is at least 10 MHz;
   etching the dielectric layer to form at least one ultra-high aspect ratio (UHAR) feature, whereas the at least one ultra-high aspect ratio feature has a width no greater than 150 nanometers (nm) and the ultra-high aspect ratio is at least 20-to-1, wherein twisting is minimized.

2. The method of claim 1, whereas the first frequency is 400 kHz.

3. The method of claim 1, whereas the first frequency is between 350 kHz and 450 kHz.

4. The method of claim 1, further comprising:
   delivering a third RF power with a third frequency into the etch reactor, whereas the third frequency is at least 40 MHz.

5. The method of claim 4, wherein the second frequency is between 27 MHz and 40 MHz.

6. The method of claim 5, wherein the delivering of the first RF power delivers the first RF power to the bottom electrode and wherein the delivering of the second RF power delivers the second RF power to the bottom electrode.

7. The method of claim 6, wherein the delivering of the third RF power delivers the third RF power to the bottom electrode.

8. The method of claim 4, wherein the second frequency is about 27 MHz.

9. The method of claim 8, wherein the delivering of the first RF power delivers the first RF power to the bottom electrode and wherein the delivering of the second RF power delivers the second RF power to the bottom electrode.

10. The method of claim 8, whereas the first frequency is between 350 kHz and 450 kHz.

11. The method of claim 1, whereas the dielectric layer is of a silicon oxide based material.

12. The method of claim 1, wherein the delivering of the first RF power delivers the first RF power to the bottom electrode and wherein the delivering of the second RF power delivers the second RF power to the bottom electrode.

13. The method of claim 12, wherein the third frequency is about 60 MHz.

14. The method of claim 1, further comprising delivering a third RF power with a third frequency into the etch reactor, wherein the third frequency is at least 40 MHz, and wherein the second frequency is between 10 MHz and 40 MHz, and wherein the delivering of the first RF power, the delivering of the second RF power and delivering of the third RF power deliver the first RF power, the second RF power, and the third RF power to the bottom electrode.

15. The method, as recited in claim 1, wherein twisting comprises deviations of location, orientation, shape, and size near bottom of a feature from a pattern defined by a mask on top of the feature.

16. A method for etching features in a dielectric layer over a substrate, comprising:
    placing the substrate with the dielectric layer on a bottom electrode inside an etch reactor;
    delivering an etch gas into the etch reactor;
    delivering a first RF power with a first frequency into the etch reactor, whereas the first frequency is between 100 kHz and 600 kHz;
    delivering a second RF power with a second frequency into the etch reactor, whereas the second frequency is at least 10 MHz; and
    etching the dielectric layer to form at least one ultra-high aspect ratio (UHAR) feature, whereas the at least one ultra-high aspect ratio feature has a width no greater than 150 nanometers (nm) and the ultra-high aspect ratio is at least 20-to-1.

17. The method, as recited in claim 16, wherein the etch gas is free of nitrogen trifluoride.

18. The method, as recited in claim 16, wherein the etch gas is free of sulfur hexafluoride.

19. The method, as recited in claim 16, wherein the etch gas is free of hydrofluorocarbon.

* * * * *